United States Patent [19]

Belanger, Jr.

[11] Patent Number: 4,848,639
[45] Date of Patent: Jul. 18, 1989

[54] COMPLIANT PAD FOR USE IN TAPE AUTOMATED BONDING PROCESS

[75] Inventor: Thomas D. Belanger, Jr., Clarendon Hills, Ill.

[73] Assignee: AG Communication Systems Corporation, Phoenix, Ariz.

[21] Appl. No.: 250,638

[22] Filed: Sep. 29, 1988

[51] Int. Cl.⁴ .................. B23K 1/12; H01L 21/603
[52] U.S. Cl. .................................. 228/5.5; 228/106
[58] Field of Search ............... 228/106, 180.2, 5.5, 228/6.2, 44.7; 156/583.3; 269/21

[56] References Cited

U.S. PATENT DOCUMENTS

| | | | |
|---|---|---|---|
| 3,627,190 | 12/1971 | Ramsey | 228/106 |
| 3,998,377 | 12/1976 | Metz | 228/106 |
| 4,638,937 | 1/1987 | Belanger, Jr. | 228/5.5 |

Primary Examiner—Richard K. Seidel
Assistant Examiner—Samuel M. Heinrich
Attorney, Agent, or Firm—Robert J. Black; Gregory G. Hendricks

[57] ABSTRACT

A compliant pad or work piece for use in bonding the inner leads of integrated circuit devices as a part of a tape automated bonding process. The work piece is constructed of a metallic base layer to which is affixed a compliant pad, a cap support and a cap positioned on said compliant pad surrounding a gas channel which is connected to a source of gas such as nitrogen. A ceramic heat distribution layer is positioned over said gas channel and acts to support the integrated circuit device to be bonded to an associated tape during the tape automated bonding process.

14 Claims, 1 Drawing Sheet

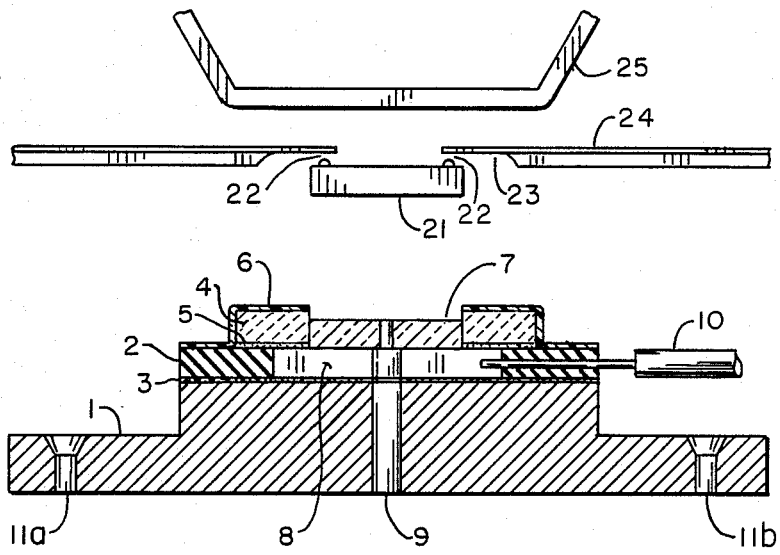

COMPLIANT PAD FOR USE IN TAPE AUTOMATED BONDING PROCESS

BACKGROUND OF THE INVENTION

1. Field of the Invention

The present invention relates to tape automated bonding processes and more particularly to the compliant pad or work piece for use in the inner lead bonding process.

2. Background Information

In the tape automated bonding process (TAB Bonding), there are two bonds typically made to complete the bonding cycle. The first bond is made to attach an integrated circuit device to a carrier tape (TAB tape), and is known as inner lead bonding. The second bond, known as an outer lead bond, is made while attaching the bonded device to a substrate assembly, and is done after the inner lead bonded device is excised from the associated carrier tape.

The inner lead bonding process requires that a heated tool (thermode) be used to clamp together the tape automated bonding process tape and the device to be bonded. A number of problems arise during this procedure, such as lack of planarity, variation in heat distribution, and of particular interest in the present application is the shielding of the device by the thermode. Previously, a number of techniques have been described for meeting with the problems of planarity and heat distribution, and providing means to effect these conditions, thus improving the inner lead bonding operation. However, the third problem, that of shielding the device by the thermode, has not been dealt with as far as is known in the technology, with the present application directed to meet that particular problem; namely, the shielding of the bond site by the thermode during the bonding cycle.

In the usual tape automated bonding process, the inner lead bonding cycle consists of placing an integrated circuit device to be bonded onto a preheated work holder, aligning a tape automated bonding tape pattern to the device, then clamping the two together and applying heat in order to create a bond.

In at least one tape automated bonding process a gold tin material system is employed wherein the gold is plated onto the device over the bonding pads to create pillars of gold known, in the industry, as gold bumps and tin is then plated to the tape. During the bonding cycle, the thermode is heated so that the interface of the gold and tin will diffuse together to form a gold/tin alloy.

Similar to the inner lead bonding procedure, the outer lead bonding operation also makes use of a reflow, or an alloying bonding technique at the interface of the beam and the substrate. Therefore, in both the inner and outer lead bonding procedures it is important to attempt to prevent surface oxidation of the tin plating. One effective way to do this during this process is to provide an inert cover gas, such as nitrogen, to flood the bonding region during the elevated bonding temperature, which is approximately 300 to 350 degrees centigrade.

The thermodes which are used for inner lead bonding must be large enough to make contact with all of the bond sites on the device. In addition, the thermode must be flat, and planar to the surface of the integrated circuit device. Experimental use has shown a need to increase the size of the thermode, so that the outer edges of the thermode extend beyond the boundary of the device to be bonded. Two reasons exist for this requirement. First, with a larger thermode it is possible to achieve a more uniform heating, and secondly, the thermode may be more evenly lapped. On small thermodes, it was found that the edges of the thermode became rounded during the lapping procedure. The rounding of the thermode's edge resulted in a reduction of the bonding area on the thermode. Therefore, to allow a larger bonding surface, the thermodes are designed so that they are larger than the required bonding area. As a result, during the bonding cycle, the oversize thermode covers and shields both the inner lead and outer lead bonding area of the tape. Under these conditions, the effectiveness of the application of the cover gas is reduced when gas is supplied from above the device.

SUMMARY OF THE INVENTION

The present invention makes use of a compliant pad structure that incorporates a heat distribution layer and combines these structures with a structure which facilitates the application of cover gas from the bottom.

The pad is composed of a compliant pad positioned or glued onto the surface of a workholder. Into the compliant pad a gas channel is cut in order to allow the cover gas (an inert gas, usually nitrogen or a mixture of hydrogen and nitrogen), which is being fed from the single port, to surround the surface during bonding. Onto the surface of the pad, and positioned over these gas channels, are supports which are glued in place and serve to hold up a polyimide cap over the pad. This latter cap is sealed to the surface of the compliant pad, and a structure is formed to establish a window which surrounds the device to be bonded, thus allowing the cover gas to exit the pad area below the tape and around the device during the bonding procedure. A benefit of having the cover gas being fed through the preheated workholder region is that it, too, becomes preheated, and therefore does not degrade the bonding temperature of the thermode.

The pad, designed in accordance with the present invention, makes use of the cap supports to also serve as positioning stops which aid in alignment of the device during the bonding cycle. Between the stops is placed a heat distribution layer. In the case of the pad shown, the layer is made from silicon. The layer which was used is an inverted device, taken from the group of devices to be bonded into which a vacuum hole was cut. This layer then serves as an extension of the actual device to be bonded, which provides a flat support under the device during application of the bonding force.

BRIEF DESCRIPTION OF THE DRAWING

The single FIGURE of the drawing discloses a crossectional view of a compliant pad for use in a tape automated bonding process in accordance with the present invention. Also shown in the same FIGURE, is an integrated circuit device to be bonded and a tape for use in the tape automated bonding process to which the device is to be bonded. Also shown is a potion of the bonding tool, or heat source, utilized in connection with the bonding process.

DESCRIPTION OF THE PREFERRED EMBODIMENT

Referring now to the single FIGURE of drawing, the present invention utilizes a steel workholder 1 which may be fastened to a bend, work table, or preheater by means of screws or similar devices inserted through openings 11A and 11B. Directly on top of the steel workholder 1 is a pad 2 of compliant material, such as silicone rubber, which is affixed to the steel workholder 1 by means of an adhesive 3. Onto the surface of the compliant pad 2 is affixed cap support and stops 4 which are constructed of a heat resistant ceramic and affixed to the compliant pad by means of adhesive 5. These supports serve to hold up the polyimide cap 6 over the entire pad structure. The cap is sealed to the surface of the compliant pad, and related structure, to form a window which surrounds the device to be bonded.

Into the compliant pad 2 a channel is cut to provide an entrance to the gas feed section 10 which is fed from the single port to surround the device during bonding. The polyimide cap, as noted, forms a window which surrounds the device to be bonded and allows the cover gas to exit the pad area below the tape and around the device during the bonding procedure.

As shown in the drawing, the device 21 is positioned over silicone pad 7 which has an opening in the center thereof. The overall intent of the tape automated bonding process is to provide a connection between the inner bond region, shown as 22, to the associated tab tape 24. As noted previously, the outer band region 23 is separate and is not included in the bonding process during its utilization of the present compliant pad arrangement. Also shown in the drawing is vacuum port 9, which is connected to a source of vacuum in order to hold device 21 in proper position between the surrounding portions of the compliant pad. With the arrangement as shown, the cover gas being fed through the preheated workholder region is also preheated and therefore does not degrade the bonding temperature of the thermode.

As can be seen with the device in position on the silicon layer 7, device 21 and the tab tape 24 are all in proper position and then the heated bonding tool or thermode 25 is lowered and performs the necessary bonding operation in response to the heat. It occurs at locations 22 which includes gold bumps placed in contact with the tinned portions of the inner bond region of the tab tape, forming an alloy of tin and gold during the bonding cycle. During the bonding cycle, the thermode is heated so that the interface of gold and tin will diffuse together forming the aforementioned gold/tin alloy. In a tape bonding procedure it is desirable to attempt to prevent surface oxidation of the tin plating that exists on the bond region of the tab tape. An inert cover gas, such as nitrogen or a mixture of hydrogen and nitrogen, which is introduced from the gas feed 10 provides this important protection by flooding the bonding region during the elevated bonding temperature, which runs between 300 to 350 degrees centigrade.

It should be further noted that the silicon 7 acts as a heat distribution layer. In this layer, a vacuum hole has been cut with the layer serving as an extension of the actual device to be bonded which provides a flat support under the device during the application of the bonding force.

It will be obvious to those skilled in the art that numerous modifications can be made without departing from the spirit and scope of the present invention which shall be limited only by the scope of the claims appended hereto.

What is claimed is:

1. A work piece for use in facilitating the creation of inner region bonds as a step in a tape automated bonding process, said work piece comprising:
   a rigid base layer, including top and bottom surfaces;
   a compliant pad, including top and bottom surfaces, said bottom surface of said pad affixed to said top surface of said rigid base;
   a gas channel surrounded by said compliant pad and located over the top surface of said rigid base;
   a cap support, including top and bottom surfaces, said bottom surface of said cap support affixed to said compliant pad top surface;
   a cap positioned over said cap support top surface;
   a heat distribution layer surrounded by said cap support and positioned over said gas channel;
   a gas feed adapted for connection to a gas source, extending through said compliant pad into said gas channel.

2. A work piece as claimed in claim 1, wherein there is further included a vacuum port adapted to be connected to a source of vacuum, extending through said base, through said gas channel and through said heat distribution layer.

3. A work piece as claimed in claim 1, wherein said rigid base is constructed of steel.

4. A work piece as claimed in claim 1, wherein: said compliant pad is affixed to said base by means of adhesive.

5. A work piece as claimed in claim 1, wherein: said cap support is affixed to said compliant pad by means of adhesive.

6. A work piece as claimed in claim 1, wherein: said compliant pad is constructed of silicone rubber.

7. A work piece as claimed in claim 1, wherein: said cap support is constructed of heat resistant ceramic material.

8. A work piece as claimed in claim 1, wherein: said cap is constructed of polyimide.

9. A work piece as claimed in claim 1, wherein: said heat distribution layer is constructed of silicon.

10. A work piece as claimed in claim 1, wherein: a gas feed is connected to a source of an inert gas.

11. A work piece as claimed in claim 1, wherein: a gas feed is connected to a source of nitrogen.

12. A work piece as claimed in claim 1, wherein: a gas feed is connected to a source of a forming gas comprising a mixture of hydrogen and nitrogen.

13. A work piece as claimed in claim 1, wherein: said compliant pad, said cap support, said cap, and said heat distribution layer are all circular in form.

14. A work piece as claimed in claim 1, wherein: said cap support further function as a stop to facilitate the positioning of devices on said work piece.

* * * * *